United States Patent [19]

Torimaru et al.

[11] Patent Number: 5,146,430

[45] Date of Patent: Sep. 8, 1992

[54] SELF-REFRESH SYSTEM FOR USE IN A FIELD MEMORY DEVICE

[75] Inventors: Yasuo Torimaru, Nara; Kouji Inoue, Osaka, both of Japan

[73] Assignee: Sharp Kabushiki Kaisha, Osaka, Japan

[21] Appl. No.: 615,876

[22] Filed: Nov. 20, 1990

Related U.S. Application Data

[63] Continuation-in-part of Ser. No. 268,499, Nov. 8, 1988, Pat. No. 4,972,376.

[30] Foreign Application Priority Data

Nov. 9, 1987 [JP] Japan .................. 62-282732

[51] Int. Cl.⁵ .................. G11C 11/406; G11C 11/408
[52] U.S. Cl. .................. 365/222; 365/233; 365/236; 365/230.02
[58] Field of Search .................. 365/222, 230.02, 236, 365/233

[56] References Cited

U.S. PATENT DOCUMENTS 4,677,592 6/1987 Sakurai et al. .................. 365/222

FOREIGN PATENT DOCUMENTS 0212547 3/1987 European Pat. Off. ............ 365/222
2111777 7/1983 United Kingdom ................ 365/222

*Primary Examiner*—Glenn Gossage

[57] ABSTRACT

A field memory self-refresh system includes a dynamic random access memory (RAM) having memory cells arranged in a matrix of rows and columns. A row decoder is designated so that the data stored in the memory cells of a row corresponding to the designated row decoder are read out. Subsequently, a row address for refreshing the memory cell array is automatically generated by a refresh address counter which is located in the dynamic RAM, whereby the memory cells on the row of the memory cell array are refreshed without any external refresh control unit. The refresh system includes a refresh RAS signal generating circuit responsive to the output of a column counter. A multiplexer selects the output of a refresh address counter, a plurality of times, between activation of successive rows in response to the refresh RAS signal. Accordingly, it is possible to perform a self-refresh operation in a shortened refresh period.

6 Claims, 5 Drawing Sheets

REFRESH RAS SIGNAL GENERATING UNIT

TIMING CHART OF PCT, RAS$_{REF}$ AND COLUMN DECODER OUTPUT

REFRESH ADDRESS INCREMENT SIGNAL GENERATING UNIT

REFRESH ADDRESS COUNTER

ADDRESS MULTIPLEXER

SELF-REFRESH SYSTEM FOR USE IN A FIELD MEMORY DEVICE

This is continuation-in part application of U.S. Pat. application, Ser. No. 07/268,499, filed on Nov. 8, 1988, now U.S. Pat. No. 4,972,376.

BACKGROUND OF THE PRESENT INVENTION

1. Field of the Present Invention

The present invention relates to a self-refresh system for use in a dynamic random access memory (dynamic RAM or DRAM hereinafter) such as a field memory for serially reading-out and writing-in image data to form an image or picture of one field of a television system.

2. Description of the Prior Art

The field memory of the above type is different from a normal memory for storing normal data and is adapted to read and write the image in series, therefore, the field memory has such a property that each memory cell of the field memory is automatically refreshed at regular periods. The period for refreshing the memory cell array of the field memory is generally 16.6 milliseconds (ms) when using the National Television System Committee (NTSC) standard television signal. On the other hand, the periods for refreshing the memory cell array of various standard dynamic RAMs such as 256 K/DRAM and 1M6/DRAM respectively, 4 ms and 8 ms, both of which are shorter than the period of 16.6 ms mentioned above; therefore, the memory cell array of such a dynamic RAM should be refreshed when using either method. Generally, there is provided a refresh control unit in an external portion of a dynamic RAM so as to refresh the memory cell array thereof at a regular period.

In the conventional refresh system, there must be provided an external control unit for refreshing the memory cell array, resulting in that the design of the device employing a field memory has been complicated and the number of the parts thereof has been increased.

SUMMARY OF THE PRESENT INVENTION

An object of the present invention is to provide a self-refresh system which is able to automatically refresh the contents of the memory cell array without any external control, thereby solving the problem mentioned above.

In a self-refresh system according to the present invention, one of the row decoders in a dynamic RAM having memory cells arranged in a matrix shape is designated so that the data stored in the memory cells of a row corresponding to the designated row decoder are read out. Subsequently, a row address for refreshing the memory cell array is automatically generated by a refresh address counter which is located int he dynamic RAM, whereby the memory cells on the row of the memory cell array are refreshed without any external refresh control unit.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENT

Figure 1:
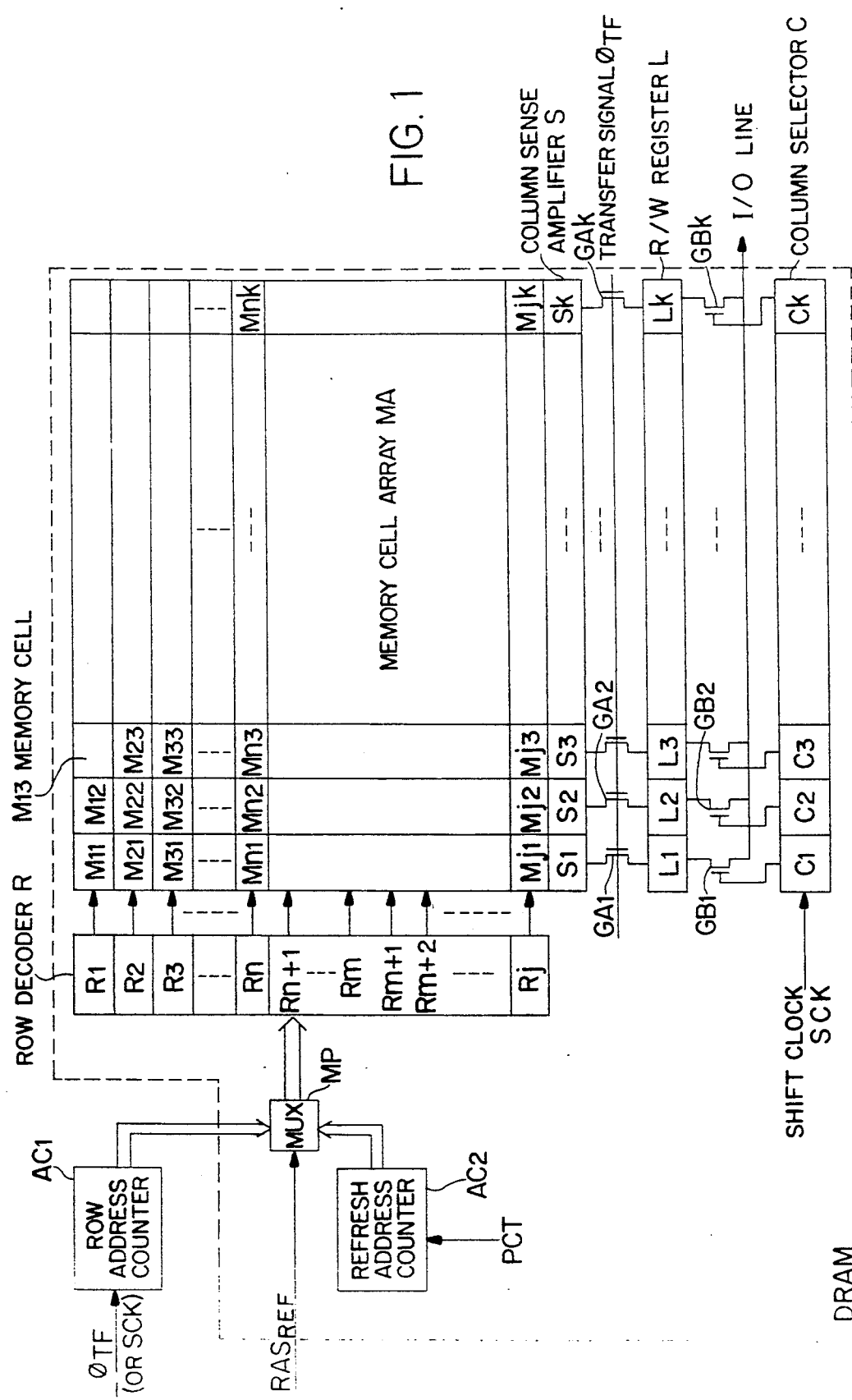
FIG. 1 is a block diagram showing an embodiment of a self-refresh system according to the present invention.

As shown in FIG. 1, there are shown a memory cell array MA of a dynamic RAM having memory cells $M_{11}, M_{12}, \ldots M_{21}, M_{22}, \ldots M_{jk}$ arranged in a matrix shape of $j = k$, a row address counter $AC_1$ for designating the address of the rows of the memory cell array MA during the period of reading or writing data, a refresh address counter $AC_2$ for designating the address of the rows of the memory cell array MA during the period of refreshing. A multiplexer MP is arranged at the output of the counters $AC_1$ and $AC_2$ so as to select either the output of the counters $AC_1$ during a read or write operation or the output of the counter $AC_2$ during a refresh operation. The output of the multiplexer MP is fed to row decoders $R_1, \ldots, R_j$ which designates the row address of the memory cell MA. All of the row decoders $R_1, R_2, \ldots, R_j$ are generally designated by R.

There are further provided column sense amplifiers $S(S_1, S2 \ldots, S_k)$, a transfer signal $\phi_{TF}$, R/W registers $L(L_1L2 \ldots, L_k)$, an input/output line I/O, column selectors $C(C_1, C2 \ldots, C_k)$ and a shift clock signal SCK. It is noted that R/W means read and write.

The operation of the self-refresh system according to the present invention will be explained with reference to FIGS. 1 and 2.

According to the contents of the row address counter $AC_1$, one row decoder $R_n$ is selected among the row decoders $R_1, R_2, \ldots, R_j$ and memory cells $M_{nl}, \ldots, M_{nk}$ on one row of the memory cell array corresponding to the decoder $R_n$ are activated among the memory cells $M_{11}, \ldots, M_{jk}$ which are arranged in two dimensions so that data previously written in the memory cells are read out through the column sense amplifiers $S_1, \ldots, S_k$. The read out data on the column sense amplifiers $S_1, \ldots, S_k$ are respectively transferred to the R/W registers $L_1, \ldots, L_k$ by the transfer signal $\phi_{TK}$ through the gates $GA_1, GA_2, \ldots, GA_k$. Subsequently, the column selectors $C_1, \ldots, C_k$ are activated in response to the shift clock signal SCK so as to turn on the column selectors in the order of $C_1, C_2, \ldots, C_k$ and then the contents of the R/W registers $L_1, \ldots, L_k$ are read out to the input/output line I/O through the gates GB1, GB2, GBk. Subsequently, the count of the row address counter $AC_1$ is incremented by one, whereby a row decoder $R_{n+1}$ is selected and the data in the memory cells $M_{(n+1)1}, \ldots, M_{(n+1)k}$ are read out on the input/output line I/O in a similar way. In this way, the entire data stored in the memory cell array MA are provided in series to an external circuit (not shown) as the output of the input/output line I/O.

Assuming that the memory cell array MA has a capacity being capable of storing the image data corresponding to one field of the standard NTSC television signal and that the number of the row decoders is equal to the number of the scan lines of one field of the NTSC television picture and since the period of the standard NTSC signal of one field is 16.6 ms, when sampling a composite video signal with a frequency of $3f_{SC}$ ($f_{SC}$ is a color sub-carrier frequency, being nearly equal to 3.58 MHz), the number j which is the maximum number of the row of the memory cell array MA and the number k which is the maximum number of the line of the memory cell array MA are as follows:

$$j = 263$$

$$k = 16.6 \text{ ms}/[(\tfrac{1}{3}f_{SC}) \times j] = 678$$

In the present example, the period from the time of the access of the memory cell $M_{11}$ to the time of the access of the memory cell $M_{jk}$ is approximately 16.6 ms, which is longer than the period for refreshing the memory cell array of a standard dynamic RAM as described above, therefore, there is a fear of destruction of the contents stored in the memory cell array MA.

Figure 2:
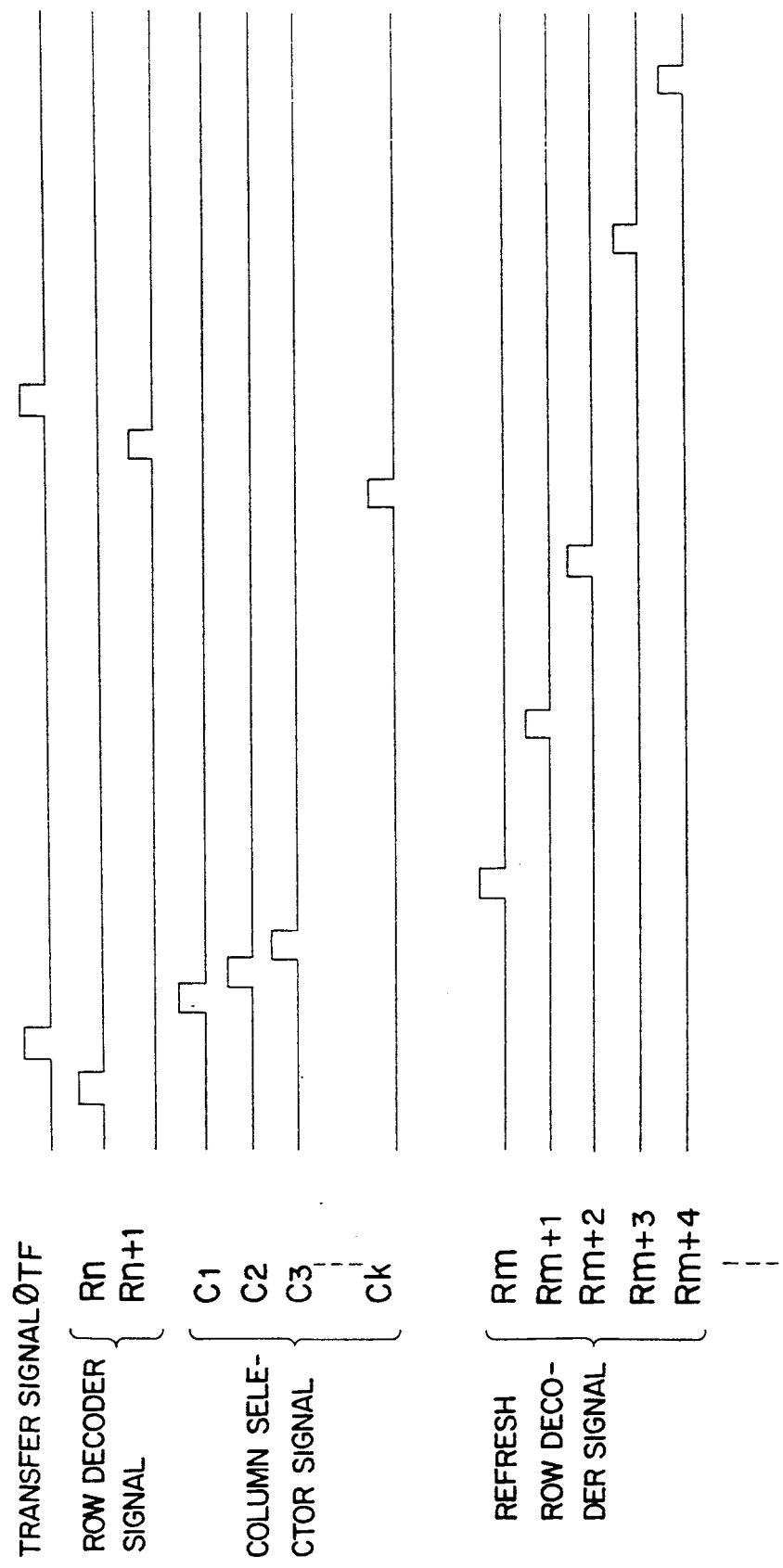
FIG. 2 is a timing chart showing the operation of the self-refresh system in FIG. 1.

As shown IN FIG. 2, in the self-refresh system according to the present invention, the data of the memory cell array MA is refreshed by generating refresh row decoder signals between pulses of transfer signal $\phi_{TF}$, more specifically when addressing one row of the memory array MA by the signal $\phi_{TD}$ is finished. For example, after the decoder $R_n$ is enabled to address the row of the memory cell array $M_{nl}$ to $M_{nk}$, the multiplexer MP is switched to the refresh address counter $AC_2$ so as to output the contents of the refresh address counter $AC_2$ so that the row decoder $R_m$ (m is not equal to n) is designated, whereby the contents of the memory cells $M_{ml}$ to $M_{mk}$ are refreshed. After the refresh of the memory cells $M_{m1}$ to $M_{mk}$ is completed, the contents of the refresh address counter $AC_2$ is advanced by 1 upon receipt of a clock signal, so that the decoder $R_{m+1}$ is designated and the contents of the memory arrays $M_{(m+1)1}$ to $M_{(m+1)k}$ are refreshed. In the examples shown in FIG. 2, there are inserted three refresh addresses $R_m$, $R_{m+1}$ and $R_{m+2}$ in an interval between the pulses of transfer signal $\phi_{TF}$. When the refresh of the memory arrays $M_{(m+2)1}$, $M_{(m+2)2}$, ..., $M_{(m+2)k}$ is finished, the multiplexer MP is switched toward the address counter $AC_1$ so that the decoder $R_{n+1}$ is designated.

It is noted that the address counters $AC_1$ and $AC_2$ may be clocked by various (address) clock signals such as clock signals $\phi_{TK}$ and/or SCK or their frequency divided signals so long as the operation mentioned above can be performed.

Similarly, in the next interval between the pulses transfer signal $\phi_{TF}$, there are inserted three refresh addresses $R_{m+3}$, $R_{m+4}$ and $R_{m+5}$ so as to generated three refresh row decoder signals between the transfer signals. Accordingly, since three refresh cycles can be performed during one cycle of the row addressing for the read/write operation of one row of the memory cell array MA the interval of one refresh cycle of each memory cell is 16.6 ms/3 = 5.5. ms.

In the example shown in FIG. 1, since the number j is 263 and the k is 678, assuming that the number of bits per memory location is 6 with the sampling $3f_{sc}$, the capacity for storing the image data of one field of the television signals is $$263 \times 678 \times 6 = 1,069,884 \text{ (1 M)}$$

Since the refresh period of the memory cell array of 1 M bits should be within 8 ms, the above-mentioned refresh period 5.5 ms in this example is short enough to satisfy the above-mentioned condition.

Assuming that the number of the refreshed rows of the memory array to be inserted between two adjacent transfer signals $\phi_{TF}$ is l, the refresh period of the memory cell array becomes 16.6 ms/l. Moreover, in case of l=1, if particularly there is defined a relation m=n+j/2 between the reading row address $R_n$ and the refresh row address $R_m$, it is possible to refresh all the memory cells in generally half a cycle, in other words, there is the same effect as in the case of l=2, reducing the consumption of the electric power.

As shown in FIG. 2, the data in the memory cells $M_{nl}$ to $M_{nk}$ of row decoder signal $R_n$ and stored int eh read register L of FIG. 1 in response to the transfer signal $\phi_{TF}$. The input data of the $(n-1)^{th}$ row (data stored in the read register L) are entered in the memory cells of the $(n-1)^{th}$ row. The serial refresh processes are carried out by the row decoder signal $R_n$ and transfer signal $\phi_{TF}$. Therefore, three refresh processes are performed with respect to the rows of m, m +1, and m +2 between the activation of the row decoder signal $R_n$ and the subsequent activation of the next row decoder signal $R_{n+1}$ base on the transfer signal $\phi_{TF}$.

Figure 3:
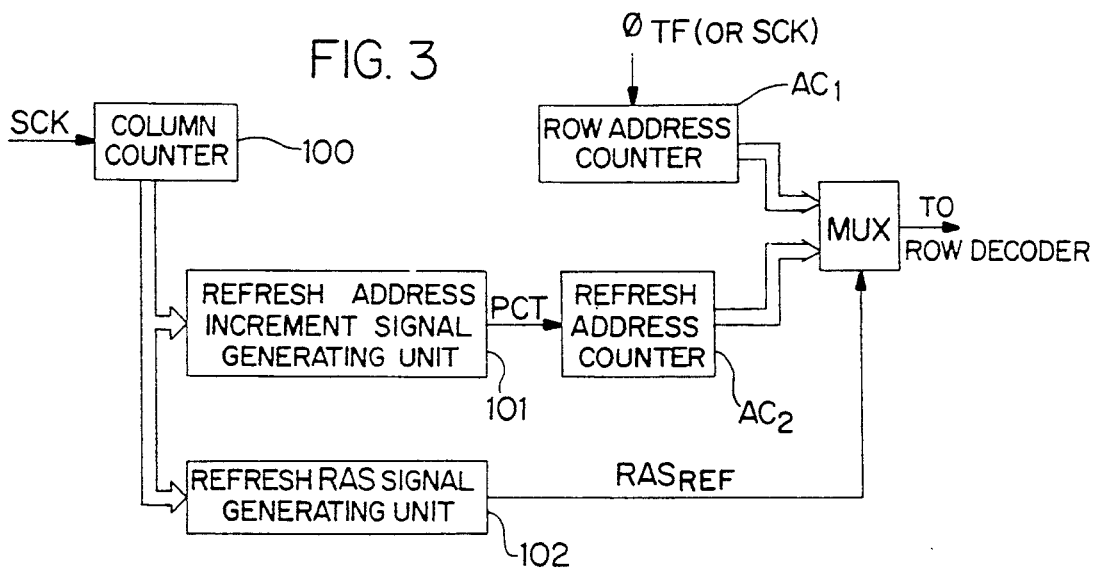
FIG. 3 shows a block diagram of a self-refresh row address generator according to the present invention.

FIG. 3 shows a block diagram of a self-refresh system according to the present invention. The self-refresh system includes a column counter 100 which counts the shift clock pulses SCK and produces a count (data information) corresponding to the counted shift clock pulses SCK. This data information is inputted into a refresh address increment signal generating unit 101 and a refresh RAS signal generating unit 102. The refresh address increment signal generating unit 101 produces a refresh address incrementing signal PCT which is inputted into refresh address counter $AC_2$. The refresh address incrementing signal PCT causes the refresh address counter $AC_2$ to increment, thereby producing a self-refresh address.

The self-refresh system also includes row address counter $AC_1$ which is incremented in response to transfer signal $\phi_{TF}$ or clock signal SCK. The output of row address counter $AC_1$ and refresh address counter $AC_2$ are inputted into multiplexer MP. The multiplexer MP selects which output (output from either $AC_1$ or $AC_2$) is inputted into the row decoder R of FIG. 1 based on the state of a $RAS_{REF}$ signal produced by the refresh RAS signal generating unit 102. The refresh RAS signal generating unit 102 decodes the count received from the column counter 100 so that the multiplexer MP is instructed to select the output from the refresh address counter $AC_2$ a plurality of times between generation of row decoding signals $R_n$ and $R_{n+1}$.

Figure 4:
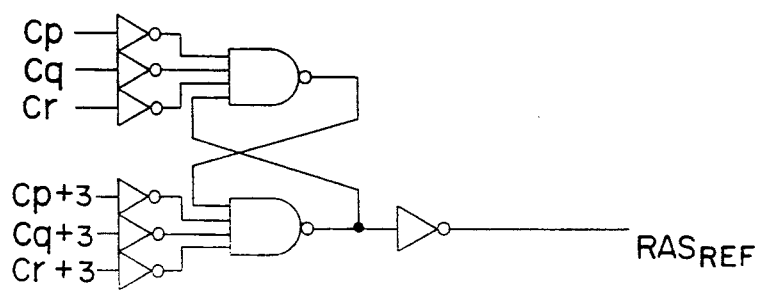
FIG. 4 shows a detailed circuit diagram of a refresh row address RAS signal generating unit according to the present invention.

A preferred refresh RAS signal generating unit 102 is shown in FIG. 4. In this embodiment, the output of the refresh address counter $AC_2$ is selected by the multiplexer MP three times between row decoding signals $R_n$ and $R_{n+a}$. This refresh RAS signal generating unit 102 can be easily modified to change the number of refresh processes occurring between row decoding signals $R_1$, $R_n$ and $R_{n+1}$ to meet the specifications of the information processing device. This modification can be readily implemented by one of ordinary skill in the art.

Figure 5:
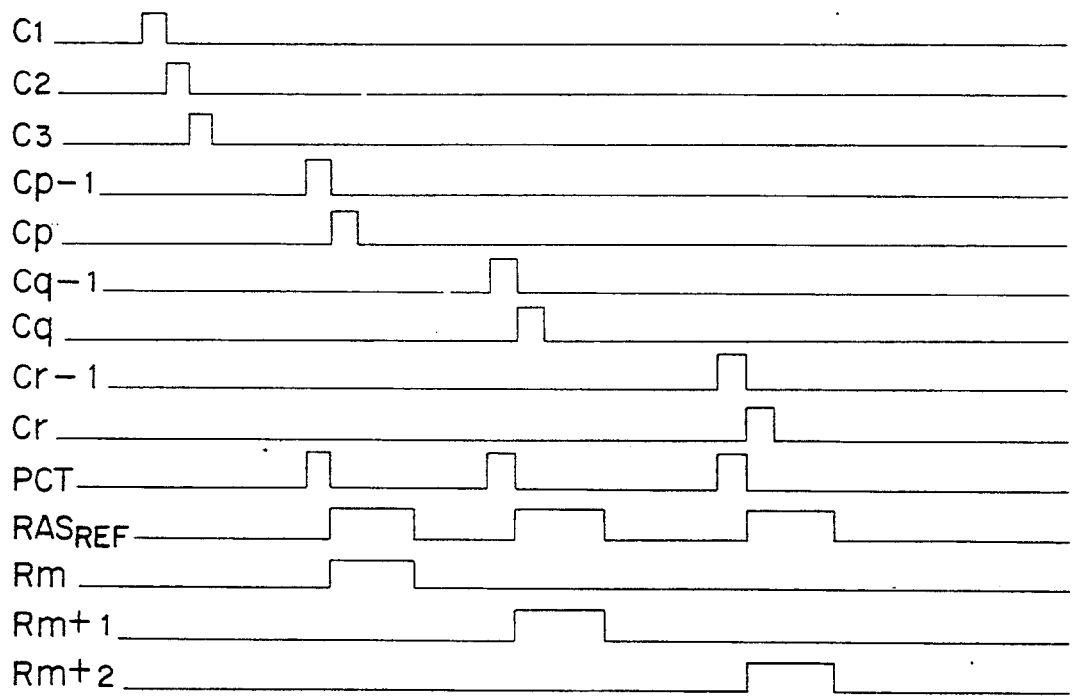
FIG. 5 shows a timing diagram of the refresh address increment signal, refresh RAS signal, and column decoder output of the present invention.

FIG. 5 shows the timing diagram of the refresh control signals produced between row decoding signals $R_n$ and $R_{n+1}$ of the preferred embodiment of the present invention. As can be seen in the example of FIG. 5, the incrementing signal PCT and the refresh address selection signal $RAS_{REF}$ are pulsed three times between the generation of row decoding signals $R_n$ and $R_{n+1}$ ($R_n$ and $R_{n+1}$ are shown in FIG. 2). This enables the refresh address counter $AC_2$ to be incremented three times and the multiplexer MP to select these three refresh addresses between generation of row decoding signals $R_n$ and $R_{n+1}$. The signals $R_m$, $R_{m+1}$, and $R_{m+2}$ represent the refresh address signals produced by the incrementing of the refresh address counter $AC_2$ in response to incrementing signal PCT.

As shown in FIG. 1, assuming that there are a number k of memory cells and selectors on one line, the refresh row address signal $RAS_{REF}$ is pulsed in response to the timing of signals p, l, and r (p, q, and r represent numbers for designating a column position) on one line so that the memory cells on rows m, m+1, and m+2 are refreshed. Therefore, the shift clock signal SCK is inputted into the column counter and the signals $C_p$, $C_q$, and $C_r$ for the p, q, and r bits are outputted and applied to the refresh RAS signal generating unit 102. The relationship between the timings of the PCT signal, $RAS_{REF}$ signal and column decoder output signal is shown in FIG. 5. Also in FIG. 5, the relationship between the refresh address increment signal PCT and column decoder output signals $C_{p-1}$, $C_{q-1}$, and $C_{r-1}$ is shown. The PCT signal is activated one clock before the refresh RAS signal, $RAS_{REF}$, is activated, thereby incrementing the refresh address counter $AC_2$ which determines the refresh row address signal.

Figure 6:
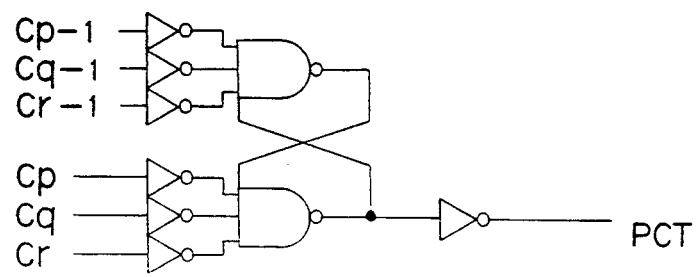
FIG. 6 shows a refresh address increment signal generating unit according to the present invention.

A preferred refresh address increment signal generating unit 101 is shown in FIG. 6. In this embodiment, the refresh address counter $AC_2$ is incremented three times between decoding signals $R_n$ and $R_{n+1}$. This refresh address increment signal generating unit 101 can be easily modified to change the number of incrementations between row decoding signals $R_n$ and $R_{n+1}$ to meet the specification of the information processing device. This modification can be readily implemented by one of ordinary skill in the art.

Figure 7:
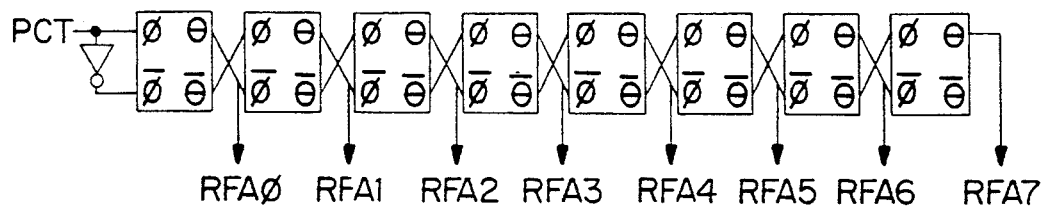
FIG. 7 shows a refresh address counter according to the present invention.

FIG. 7 shows a preferred refresh address counter $AC_2$ comprising flip-flops for generating the refresh address signal in response to the refresh address increment signal PCT.

Figure 8:
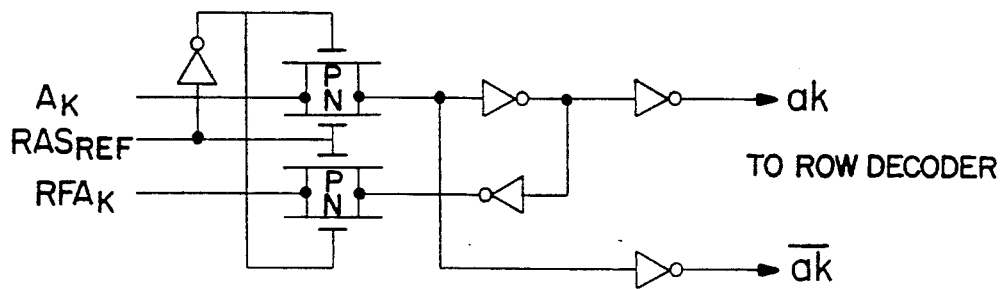
FIG. 8 shows an address multiplexer according to the present invention.

FIG. 8 shows a preferred address multiplexer MP. This address multiplexer MP selects either the address signal $A_k$ from the row address counter AC, or the refresh address signal $AR_k$ from the refresh address counter $AC_2$ depending upon the state of $RAS_{REF}$.

As described above, the shift clock SCK advances by one line (one column) and the read/write operation of one line of data is performed. At the same time, the refresh address and refresh row address signals are produced based on the shift clock signal SCK so as to control the refresh process.

According to the present invention, the refresh operation of the field memory array can be performed by the control signals used in the field memory array, therefore it is possible to perform the refresh operation of the memory cell array without any specific external refresh control units and external control signals so, that the number of the parts of the refresh system can be reduced and the design of the refresh system is simplified. Moreover, since the refresh period can be shortened by increasing the number of the refresh addresses, the period of the shift clock signal can be lengthened so that the operating margin of the memory can be expanded.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A field memory self-refresh system comprising:
   control means for generating a shift clock signal and a transfer signal;
   row address means for generating a first address to be utilized during read and write operations and being incremented in response to an address clock signal; and
   an integrated dynamic random access memory including,
      dynamic memory means for storing data according to said first address during said write operation and for outputting data according to said first address during said read operation,
      column counter means for generating a column count signal in response to said shift clock signal,
      refresh address incrementing means, responsive to said column count signal, for producing an incrementing signal according to a decoding of said column count signal,
      refresh select signal generating means, responsive to said column count signal, for producing a refresh select signal according to a decoding of said column count signal,
      refresh address means, responsive to said incrementing signal, for generating a second address to be utilized in a refresh operation, said second address being not equal to said first address,
      selecting means, responsive to said refresh select signal, for applying a selected one of said first address and said second address to said dynamic memory means according to said refresh select signal,
      latch means for latching data read from said dynamic memory means during a read operation, and
      output means for serially outputting data from said latch means in response to said transfer signal.

2. The self-refresh system as claimed in claim 1, wherein said dynamic memory means is a field memory array for storing image data for a television system.

3. The self-refresh system as claimed in claim 1, said selecting means selects said second address after said transfer signal is generated and said dynamic memory means has a portion thereof refreshed according to said second address.

4. The self-refresh system as claimed in claim 1, wherein said address clock signal is said shift clock signal.

5. The self-refresh system as claimed in claim 1, wherein said address clock signal is said transfer signal, and said output means has transfer gates which transfer data from said latch means to an input/output (I/O) line.

6. The self-refresh system as claimed in claim 5, wherein a refresh operation is performed a plurality of times between successive occurrences of pulses of said transfer signal.

* * * * *

UNITED STATES PATENT AND TRADEMARK OFFICE
CERTIFICATE OF CORRECTION

PATENT NO. : 5,146,430  
DATED : September 8, 1992  
INVENTOR(S) : Yasuo TORIMARU, Kouji INOUE Page 1 of 4

It is certified that error appears in the above-identified patent and that said Letters Patent is hereby corrected as shown below:

IN THE DRAWINGS:

Please replace Figure 1 with the following Figure 1.

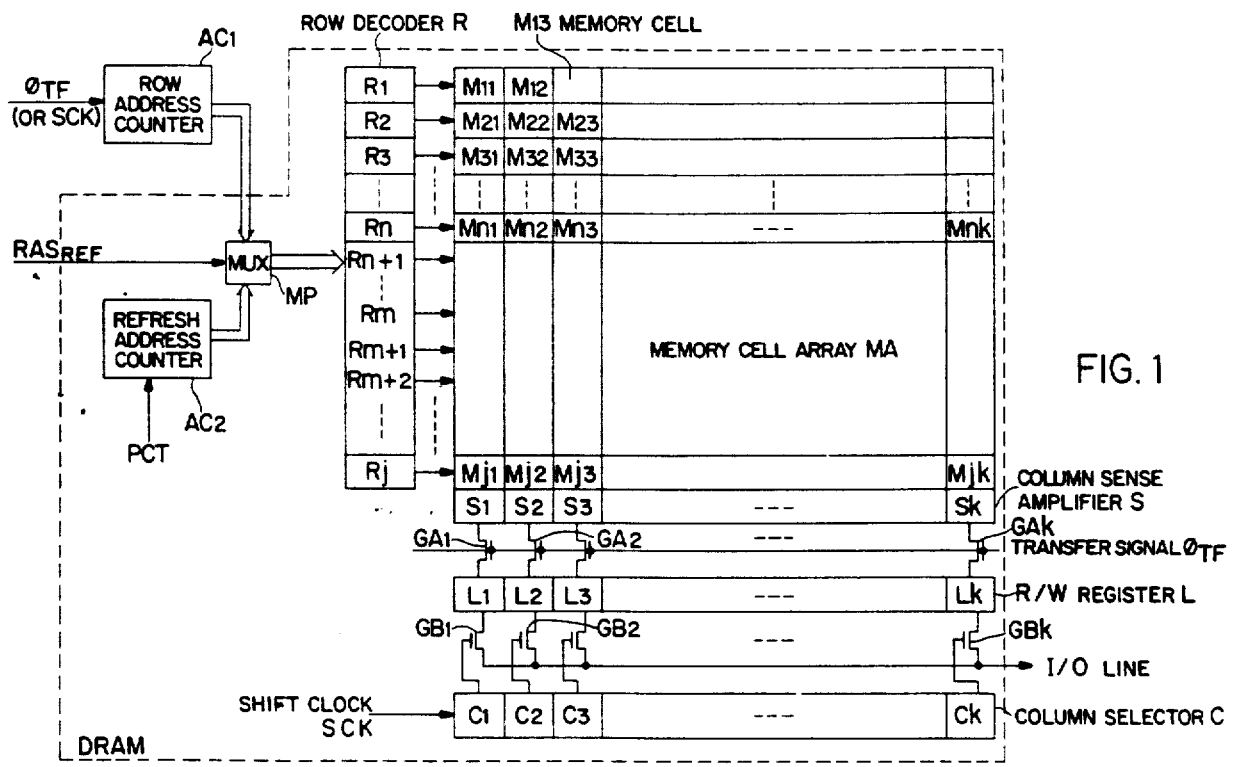

FIG. 1

UNITED STATES PATENT AND TRADEMARK OFFICE
CERTIFICATE OF CORRECTION

PATENT NO. : 5,146,430

DATED : September 8, 1992

INVENTOR(S) : Yasuo TORIMARU, Kouji INOUE

It is certified that error appears in the above-identified patent and that said Letters Patent is hereby corrected as shown below:

Please replace Figure 6 with the following Figure 6.

FIG. 6

REFRESH ADDRESS INCREMENT SIGNAL GENERATING UNIT

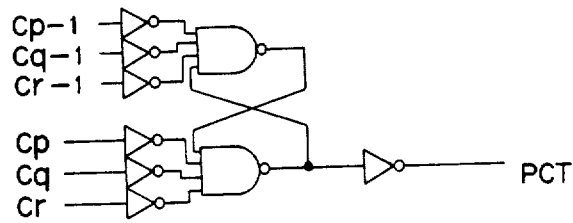

UNITED STATES PATENT AND TRADEMARK OFFICE
CERTIFICATE OF CORRECTION

PATENT NO. : 5,146,430

DATED : September 8, 1992

INVENTOR(S) : Yasuo TORIMARU, Kouji INOUE

It is certified that error appears in the above-identified patent and that said Letters Patent is hereby corrected as shown below:

Please replace Figure 7 with the following Figure 7.

FIG. 7

REFRESH ADDRESS COUNTER

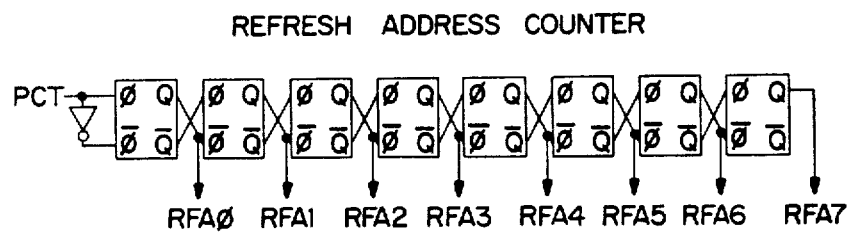

UNITED STATES PATENT AND TRADEMARK OFFICE
CERTIFICATE OF CORRECTION

PATENT NO. : 5,146,430

DATED : September 8, 1992

INVENTOR(S) : Yasuo Torimaru, et al.

It is certified that error appears in the above-indentified patent and that said Letters Patent is hereby corrected as shown below:

FIG. 8
ADDRESS MULTIPLEXER

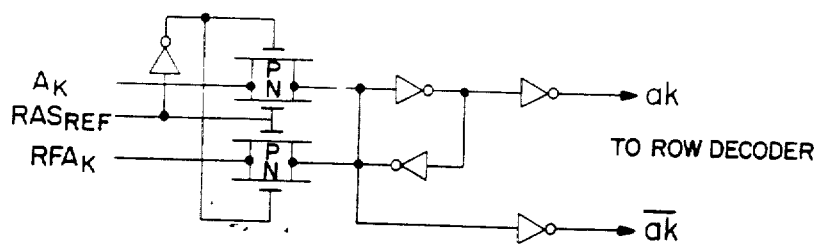

Signed and Sealed this

Twenty-first Day of December, 1993

Attest:

BRUCE LEHMAN

*Attesting Officer*  *Commissioner of Patents and Trademarks*